(12) United States Patent
Park et al.

(10) Patent No.: US 8,859,413 B2
(45) Date of Patent: Oct. 14, 2014

(54) METHOD OF GROWING GAN CRYSTAL ON SILICON SUBSTRATE, AND LIGHT EMITTING DEVICE AND METHOD OF MANUFACTURING THEREOF

(75) Inventors: Sung-soo Park, Seongnam-si (KR); June-key Lee, Seongnam-si (KR)

(73) Assignee: Samsung Corning Precision Materials Co., Ltd., Gyeongsangbuk-do (KR)

( * ) Notice: Subject to any disclaimer, the term of this patent is extended or adjusted under 35 U.S.C. 154(b) by 1246 days.

(21) Appl. No.: 12/073,097

(22) Filed: Feb. 29, 2008

(65) Prior Publication Data

US 2008/0283821 A1 Nov. 20, 2008

(30) Foreign Application Priority Data

May 17, 2007 (KR) .................. 10-2007-0048309

(51) Int. Cl.
*H01L 21/28* (2006.01)
*H01L 21/02* (2006.01)
*H01L 33/00* (2010.01)
*H01L 33/12* (2010.01)
*H01L 33/20* (2010.01)

(52) U.S. Cl.
CPC .... *H01L 21/02381* (2013.01); *H01L 21/02488* (2013.01); *H01L 33/007* (2013.01); *H01L 21/0254* (2013.01); *H01L 21/02639* (2013.01); *H01L 33/20* (2013.01); *H01L 21/02645* (2013.01); *H01L 21/02491* (2013.01); *H01L 33/12* (2013.01)
USPC .............................. 438/604; 438/605; 438/607

(58) Field of Classification Search
CPC . H01L 29/2003; H01L 21/0254; H01L 33/32; H01L 33/0075; H01L 21/02458; H01L 33/06; H01L 33/007; H01L 33/08; H01L 33/24

USPC ................................................... 438/602–610
See application file for complete search history.

(56) References Cited

U.S. PATENT DOCUMENTS

| | | | | |
|---|---|---|---|---|
| 2002/0068466 | A1* | 6/2002 | Lee et al. ...................... | 438/765 |
| 2002/0197825 | A1* | 12/2002 | Usui et al. ..................... | 438/459 |
| 2004/0106274 | A1* | 6/2004 | Dokumaci et al. ............ | 438/585 |
| 2005/0156180 | A1* | 7/2005 | Zhang et al. .................... | 257/79 |
| 2006/0172512 | A1* | 8/2006 | Hiramatsu et al. ............. | 438/483 |
| 2007/0085093 | A1* | 4/2007 | Ohmae et al. ................... | 257/89 |
| 2008/0318003 | A1* | 12/2008 | Chua et al. ..................... | 428/141 |

FOREIGN PATENT DOCUMENTS

| | | |
|---|---|---|
| KR | 2005-0088960 | 9/2005 |
| KR | 2007-0011550 | 1/2007 |
| WO | WO 2006025793 A1 * | 3/2006 |

OTHER PUBLICATIONS

Korean Office Action dated Sep. 30, 2008.

* cited by examiner

*Primary Examiner* — H Tsai
(74) *Attorney, Agent, or Firm* — Harness, Dickey & Pierce, P.L.C.

(57) ABSTRACT

Example embodiments are directed to a method of growing GaN single crystals on a silicon substrate, a method of manufacturing a GaN-based light emitting device using the silicon substrate, and a GaN-based light emitting device. The method of growing the GaN single crystals may include forming a buffer layer including a TiN group material or other like material on a silicon substrate, forming a nano-pattern including silicon oxide on the buffer layer, and growing GaN single crystals on the buffer layer and the nano-pattern.

7 Claims, 11 Drawing Sheets

METHOD OF GROWING GAN CRYSTAL ON SILICON SUBSTRATE, AND LIGHT EMITTING DEVICE AND METHOD OF MANUFACTURING THEREOF

FOREIGN PRIORITY STATEMENT

This application claims priority under 35 U.S.C. §119 to Korean Patent Application No. 10-2007-0048309, filed on May 17, 2007 in the Korean Intellectual Property Office, the entire contents of which are incorporated herein by reference.

BACKGROUND

1. Field

Example embodiments are directed to a method of growing GaN single crystals on a silicon substrate, a method of manufacturing a GaN-based light emitting device using the silicon substrate, and a GaN-based light emitting device manufactured using the silicon substrate. Example embodiments include a method of growing GaN single crystals using a TiN group metal nitride as a buffer layer, a method of manufacturing a GaN-based light emitting device using a silicon substrate, and a GaN-based light emitting device manufactured using a silicon substrate.

2. Description of the Related Art

Nitride group semiconductors such as GaN may be used in light emitting devices, and examples of such light emitting devices include blue-violet light emitting diodes and laser diodes and electronic devices with higher switching speed and higher output.

SUMMARY

To manufacture various semiconductor devices, including those discussed above, a sapphire substrate or a silicon carbide (SiC) substrate may be used. FIG. 1 is a cross-sectional view of an example embodiment of a conventional light emitting device 1 manufactured using a sapphire substrate. Referring to FIG. 1, the light emitting device 1 may include a GaN buffer layer 12, an n-GaN layer 14, an active layer 16, and a p-GaN layer 18, for example, and these layers may be sequentially formed on a sapphire substrate 10. A p-electrode 20 and an n-electrode 22 may be required to apply power in order to combine electrons and holes in the active layer 16. The p-electrode 20 may be formed on the p-GaN layer 18 and the n-electrode 22 may be formed on the n-GaN layer 14. A dry etching process or other like process for etching portions of regions of the p-GaN layer 18 and the active layer 16 may be performed to form the n-electrode 22, because the sapphire substrate 10 may be non-conductive and otherwise it may not be possible to form an electrode on a lower surface of the sapphire substrate 10.

In an example embodiment of the light emitting device 1 having the above structure, if the sapphire substrate 10 can be replaced by a silicon substrate, manufacturing costs may be reduced since the cost of the silicon substrate may be less than the sapphire substrate 10, the SiC substrate, or other like substrate. A larger silicon substrate or other like substrate may be used in the above light emitting device 1, and this may also achieve cost reduction. Also, due to the higher electrical conductivity of the silicon substrate or other like substrate, an electrode may be formed on a lower surface of the silicon substrate, and this may result in reduced manufacturing processes.

However, a GaN light emitting device may not use a silicon substrate because thermal expansion may cause severe cracks to form between the silicon substrate and the GaN thin film layer. A method of using a buffer layer formed of AlN between the silicon substrate and the GaN thin film layer may address this problem. However, the higher electrical conductivity and higher thermal conductivity of the silicon substrate may not be utilized because the AlN layer has a lower electrical conductivity.

Example embodiments provide a method of growing a GaN single crystal thin film on a silicon or other like substrate using a buffer layer formed of TiN or other like material that may have higher electrical conductivity and thermal conductivity, and a method of manufacturing a GaN-based light emitting device using a silicon substrate.

Example embodiments also provide a GaN-based light emitting device including a silicon substrate.

A method of growing GaN single crystals may include forming a buffer layer comprising a TiN group material on a silicon substrate, forming a nano-pattern comprising silicon oxide on the buffer layer, and growing GaN single crystals on buffer layer and the nano-pattern.

Example embodiments provide a method of manufacturing a light emitting device that may include forming a buffer layer using a TiN group material on a silicon substrate, forming a nano-pattern using silicon oxide on the buffer layer, forming an n-GaN layer on the buffer layer and the nano-pattern, forming an active layer on the n-GaN layer, forming a p-GaN layer on the active layer, and forming a p-electrode and an n-electrode.

Example embodiments also provide a light emitting device that may include a silicon substrate, a buffer layer formed of a TiN group material on the silicon substrate, a nano-pattern formed of $SiO_2$ on the buffer layer, an n-GaN layer formed on the buffer layer and the nano-pattern, an active layer formed on the n-GaN layer, and a p-GaN layer formed on the active layer.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
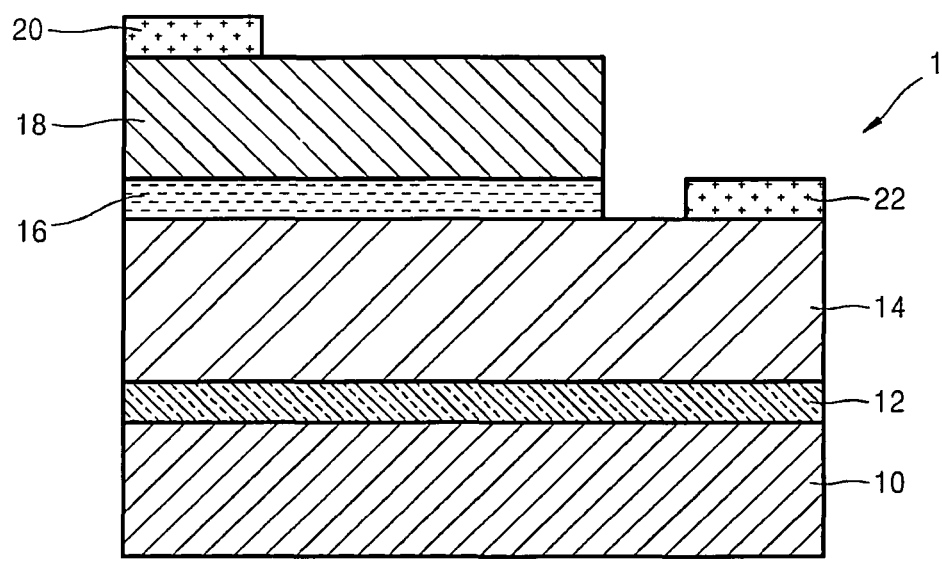
FIG. 1 is a schematic cross-sectional view of a structure of a conventional light emitting device manufactured using a sapphire substrate.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2A:
FIGS. 2A through 2G are cross-sectional views illustrating a method of growing GaN single crystals according to example embodiments.
Figure 2B:
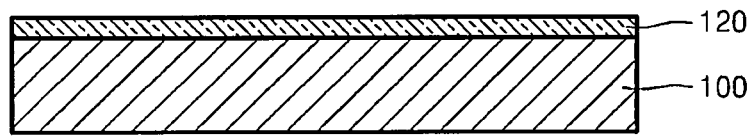

Referring to FIG. 2A, a silicon substrate 100 as a substrate for growing a GaN single crystal thin film thereon may be prepared. As shown in FIG. 2B, a buffer layer 120 may be formed on the silicon substrate 100. The buffer layer 120 may be formed of a TiN group metal nitride or other like metal nitride having higher corrosion and erosion resistance, higher electrical conductivity, and higher adhesion. Other metal nitrides may include $Al_xTi_{1-x}N$, where $0 \le x \le 0.5$, or $Cr_xTi_{1-x}N$, where $0 \le x \le 0.5$, for example. The thickness of the buffer layer 120 may affect the growth of the GaN single crystal thin film. The thickness of the buffer layer 120 may be between 1 and 50 nm, for example, and the optimum thickness of the buffer layer 120 may be determined.

Figure 2C:
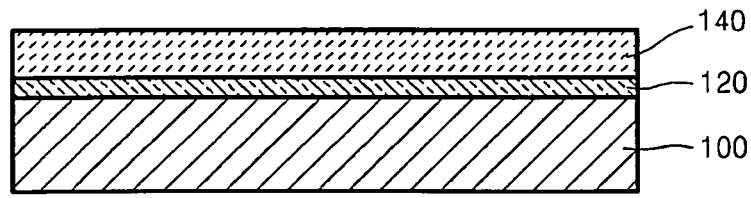
Figure 2D:
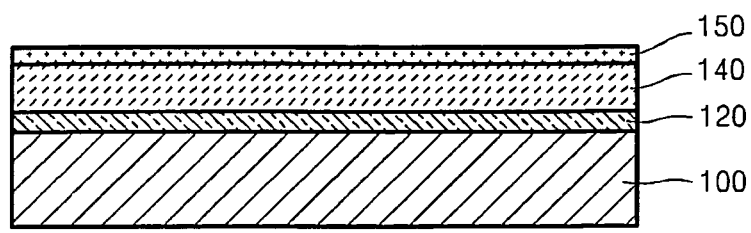

Referring to FIGS. 2C and 2D, a $SiO_2$ layer 140 and a metal layer 150 may be formed on the buffer layer 120, and the $SiO_2$ layer 140 and the metal layer 150 may be sequentially formed on the buffer layer 120, for example. The metal layer 150 may be formed of Au or other like metal.

Figure 2E:
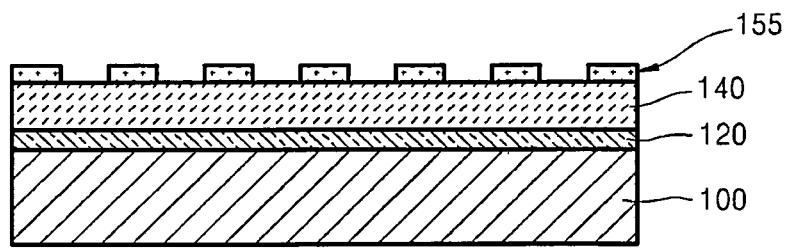
Figure 3A:
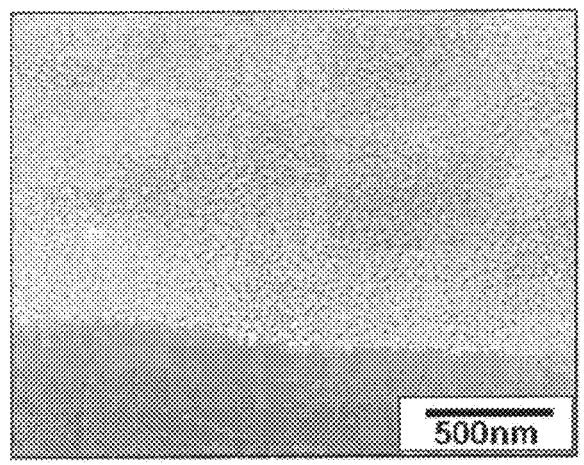
FIGS. 3A through 3C are microscopic images of metal nano-clusters formed by annealing metal layers formed of Au to thicknesses of 50 Å, 150 Å, and 300 Å, respectively, according to example embodiments.
Figure 3B:
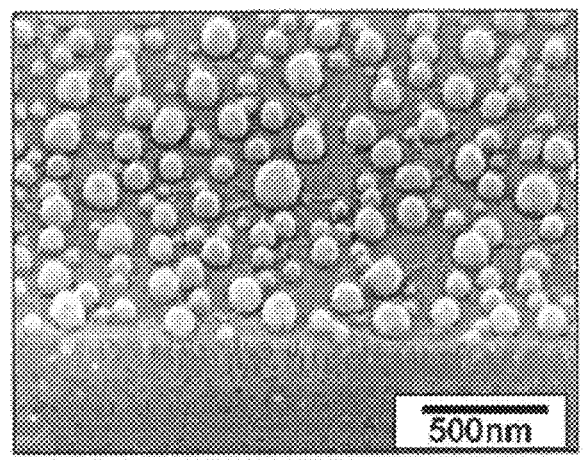
Figure 3C:
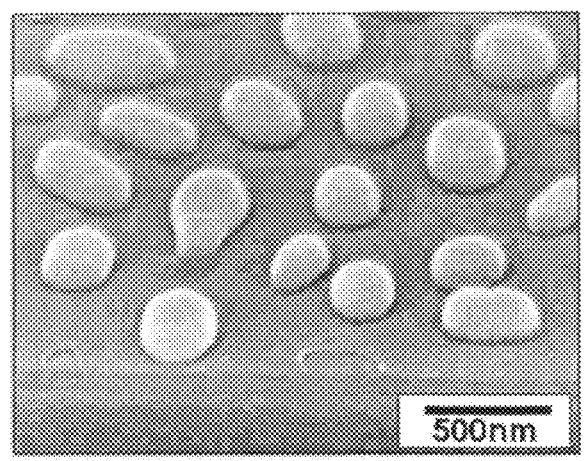
Figure 4A:
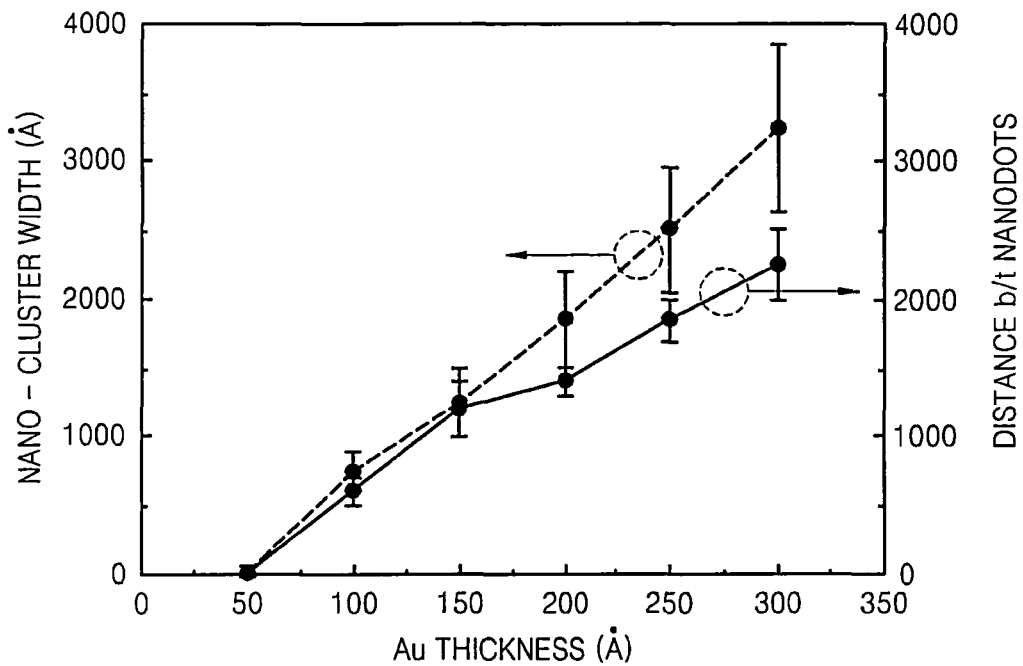
FIGS. 4A and 4B are graphs showing various characteristics of metal nano-clusters formed by annealing according to varying thicknesses of metal layers formed of Au according to example embodiments.
Figure 4B:
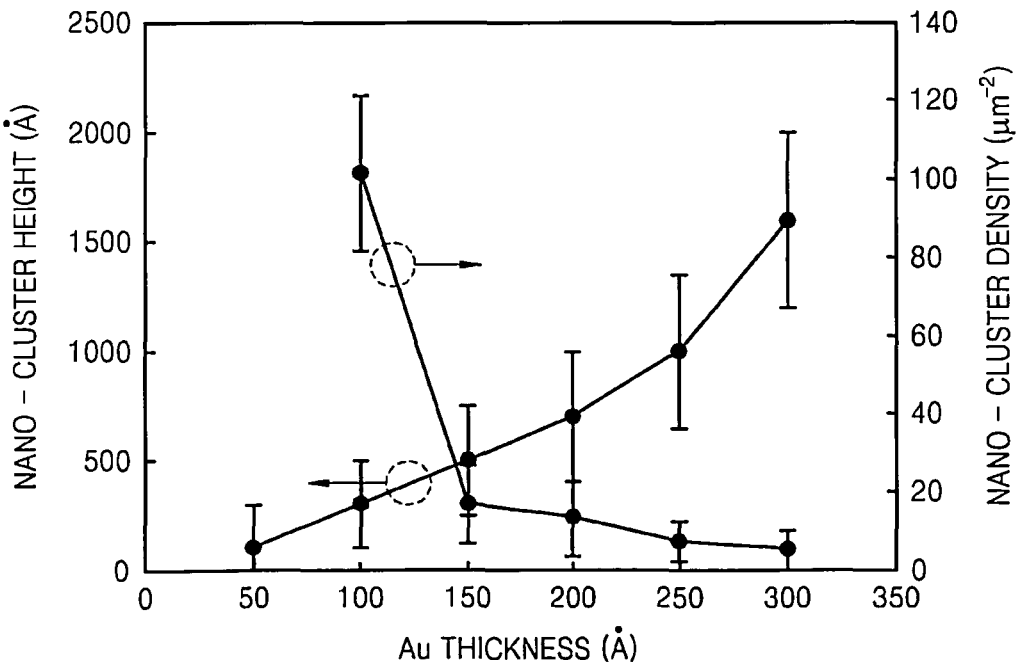

Referring to FIG. 2E, a metal nano-cluster 155 formed of a plurality of metal nano-dots may be formed by annealing the metal layer 150. The density, width, and/or height of the metal nano-cluster 155 and of the gaps between the metal nano-dots may be controlled by the thickness and/or the annealing condition of the metal layer 150. FIGS. 3A through 3C are microscopic images of metal nano-clusters according to example embodiments formed by annealing metal layers formed of Au to thicknesses of 50 Å, 150 Å, and 300 Å, respectively, at a temperature of 600° C. for 1 minute under an air atmosphere. FIG. 4A is a graph showing the width of metal nano-dots of the metal nano-cluster and the distance between successive nano-dots according to the thicknesses of Au used as the metal layers 150. FIG. 4B is a graph showing the height and density of the metal nano-dots of the metal nano-cluster according to the thicknesses of Au used as the metal layers 150. Referring to FIGS. 4A and 4B, when the thickness of Au is in a range of 50 to 300 Å, for example, a nano-cluster with nano-dots having a width of 50 to 300 nm, a height of 10 to 160 nm, and gaps of 50 to 200 nm between the nano-dots may have a density of 5 to 100 ea/$\mu m^2$.

Figure 5:
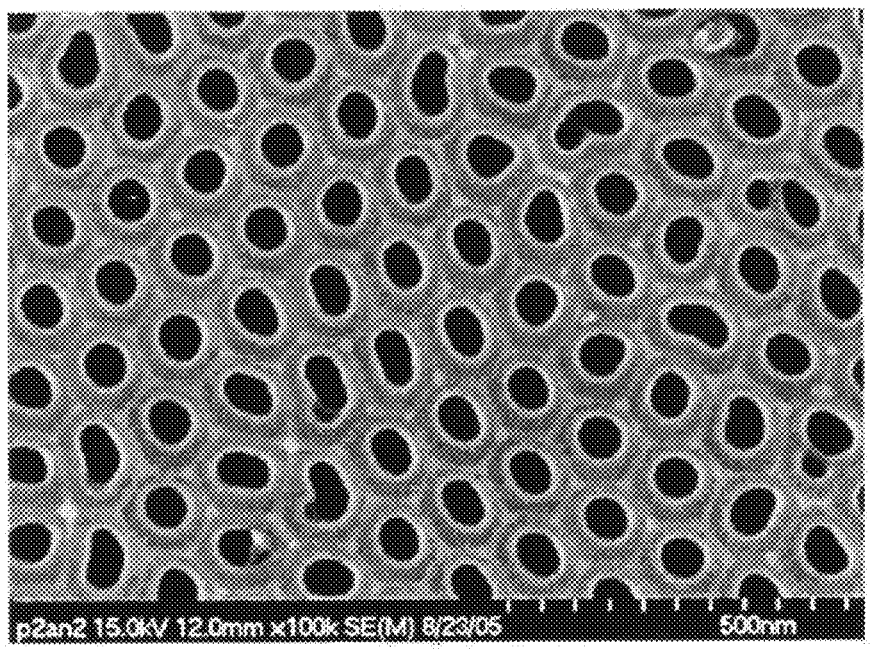
FIG. 5 is a microscopic image of a metal nano-cluster formed of anodized aluminum oxide (MO) according to example embodiments.

Also, as example embodiments provide, the metal nano-cluster 155 may be formed by anodizing. For example, the metal layer 150 may be formed of Al, and the metal nano-cluster 155 may be formed by anodizing the Al. FIG. 5 is a microscopic image of example embodiments of a metal nano-cluster 155 formed of anodized aluminum oxide (AAO). In this example, the anodizing was performed at a temperature of 10° C. using 0.3M oxalic acid, and a pore widening process was performed at a temperature of 20° C. using 5.4 wt % phosphoric acid.

Figure 2F:
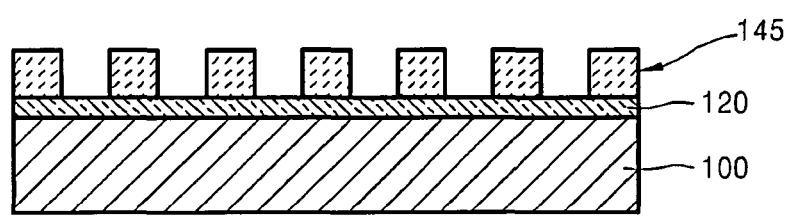

Referring to FIG. 2F, a nano-pattern 145 formed of silicon oxide may be formed by dry etching the $SiO_2$ layer 140 using the metal nano-cluster 155 as a mask and stripping the metal nano-cluster 155.

Example embodiments of the process of forming the nano-pattern 145 using the metal nano-cluster 155 as a mask after the metal nano-cluster 155 is formed are described with reference to FIGS. 2C through 2F, although the nano-pattern 145 may be formed using a conventional photolithography process or other like process. However, forming the nano-pattern 145 using the metal nano-cluster 155 formed by annealing the metal layer 150 or using AAO as a mask may be economical and/or reduce manufacturing processes.

Figure 2G:
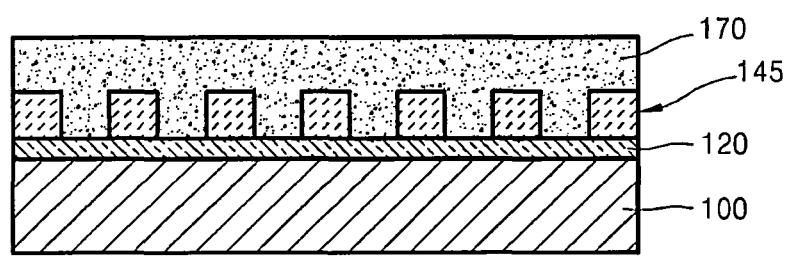

Referring to FIG. 2G, GaN single crystals 170 may be grown from the buffer layer 120 over the nano-pattern 145. TiN and GaN have a lattice constant difference (i.e., a rate of lattice mismatch) of approximately 6%, that is, $d_{TiN\{220\}}$ is 0.149 nm and $d_{GaN\{11\_20\}}$ is 0.159 nm, and thus, the rate of lattice mismatch is approximately 6.3%. Accordingly, the rate of lattice mismatch of approximately 20% between silicon and GaN may be buffered. For example, if the buffer layer 120 is formed of AlN as in the prior art, $d_{AlN\{11\_20\}}$ is 0.155 nm and $d_{GaN\{11\_20\}}$ is 0.159 nm, and thus, the rate of lattice mismatch is approximately 2.5%. That is, the lattice constant difference (2.5%) between AlN and GaN is lower than lattice constant differences exhibited by example embodiments. However, due to the higher resistivity of AlN, the advantages of the silicon substrate having higher electrical conductivity may not be used. As example embodiments illustrate, TiN has a lower resistivity and it may function with the silicon substrate. Also, TiN has a thermal expansion coefficient between those of GaN and silicon and accordingly, the occurrence of cracks due to thermal expansion difference may be reduced when the GaN single crystals 170 are grown. $SiO_2$ is amorphous and may absorb stress transmitted to the GaN single crystals 170. Also, since the GaN single crystals 170 may be formed over the nano-pattern 145 formed of $SiO_2$, a similar effect to an epitaxial lateral overgrowth (ELOG) is possible. Thus, higher quality GaN single crystals 170 having higher crystallinity may be grown, and for example, the GaN single crystals 170 grown between the adjacent nano-patterns 145 may have a defect density of greater than $10^9$ ea/cm$^2$. Additionally, the GaN single crystals 170 grown above the nano-patterns 145 may have a defect density of approximately $10^6$ to $10^7$ ea/cm$^2$.

Figure 6:
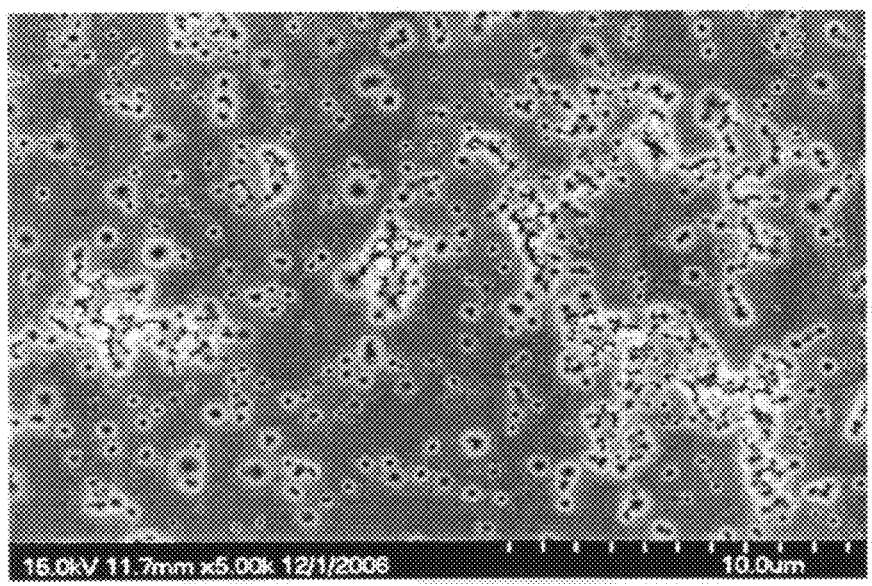
FIG. 6 is a microscopic image of a sample of GaN single crystals grown on a silicon substrate according to example embodiments.
Figure 7:
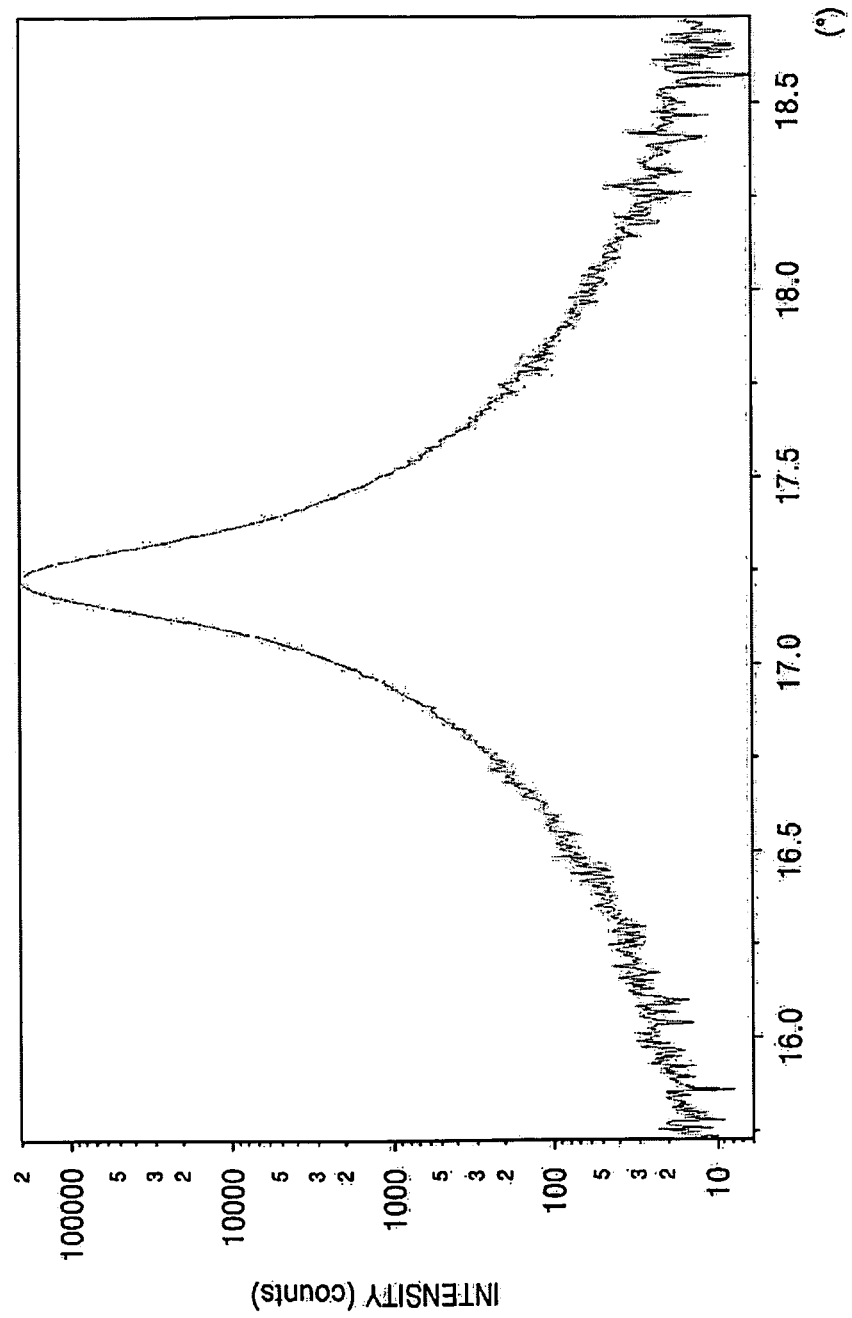
FIGS. 7 and 8 respectively are graphs showing XRD locking curves measured at (002) plane and (102) plane according to example embodiments.
Figure 8:
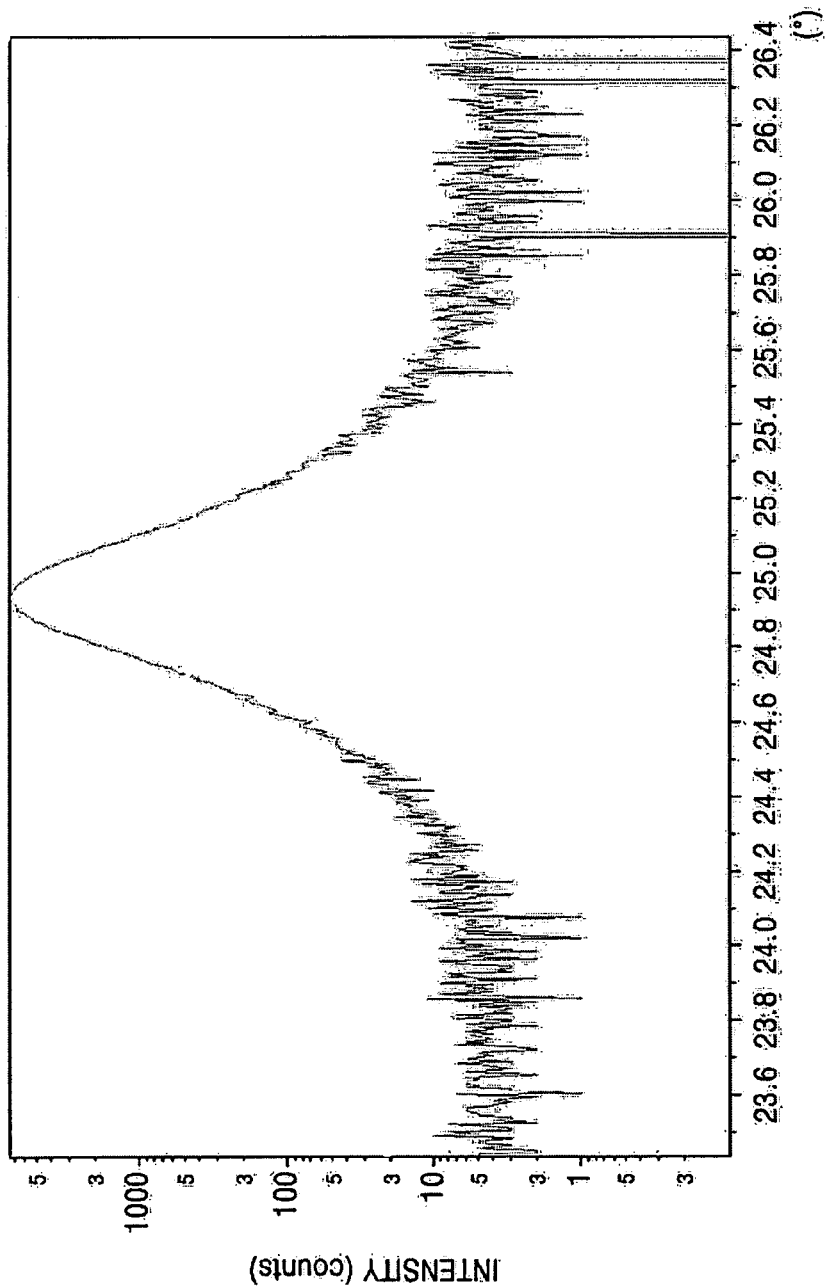

FIG. 6 is a microscopic image of example embodiments of GaN single crystals grown on a silicon substrate, and FIGS. 7 and 8 respectively are graphs showing XRD locking curves measured at (002) plane and (102) plane with respect to the GaN single crystals of FIG. 6. The GaN single crystal has the buffer layer formed of TiN to a thickness of 20 nm, and the nano-pattern may be formed using the metal nano-cluster 155 formed of MO as a mask, for example. Referring to FIGS. 7 and 8, a full width at half maximum (FWHM) at (002) plane is approximately 377 arcsec, and that of at (102) plane is approximately 655 arcsec.

Example embodiments of a GaN-based light emitting device that uses a silicon substrate and a method of manufacturing the GaN-based light emitting device will now be described with reference to FIGS. 9A through 9D. FIGS. 9A through 9D are cross-sectional views illustrating a method of manufacturing the GaN-based light emitting device, according to example embodiments.

Figure 9A:
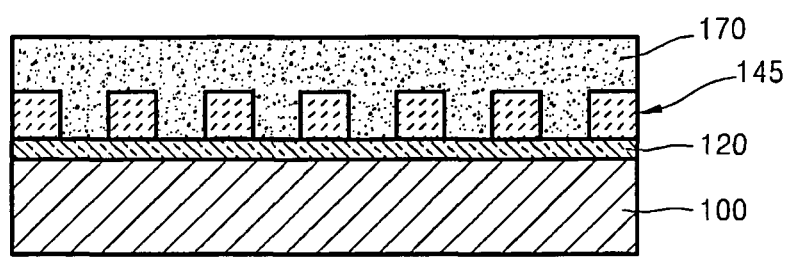
FIGS. 9A through 9D are cross-sectional views illustrating a method of manufacturing a GaN-based light emitting device, according to example embodiments.

Referring to FIG. 9A, a buffer layer 120, a nano-pattern 145 formed of silicon oxide, and GaN single crystals 170 grown over the buffer layer 120 and the nano-pattern 145 may be formed on a silicon substrate 100. The above structure and method of manufacturing thereof may be the same as those described with reference to FIGS. 2A through 2G. That is, the buffer layer 120 may be formed of a TiN group metal nitride or other like metal nitride, for example $Al_xTi_{1-x}N$ where $0 \leq x \leq 0.5$, or $Cr_xTi_{1-x}N$ where $0 \leq x \leq 0.5$. The nano-pattern 145 formed of silicon oxide may be formed using a metal nano-cluster formed by annealing a metal layer, or using AAO as a mask, or can be formed using a conventional photo lithography method or other like method.

Figure 9B:
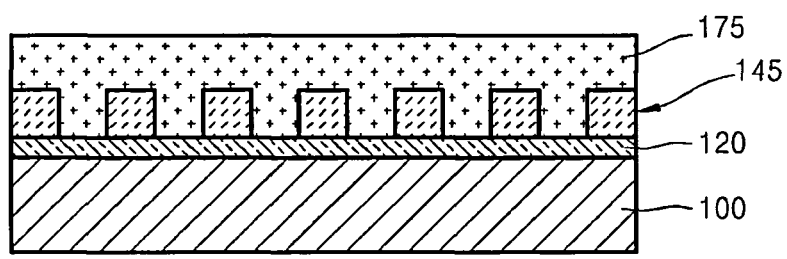

Referring to FIG. 9B, an n-GaN layer 175 may be formed by doping an n-type dopant in the GaN single crystals 170, for example.

Figure 9C:
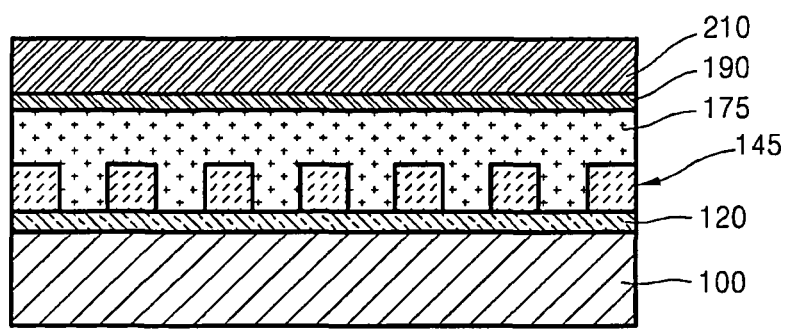

Referring to FIG. 9C, an active layer 190 and a p-GaN layer 210 may be formed on the n-GaN layer 175, and the active layer 190 and p-GaN layer 210 may be formed sequentially on the n-GaN layer 175. The active layer 190 may be formed of a GaN-based Group III-V nitride semiconductor or the like. The active layer 190 may have a single quantum well structure or a multi-quantum well structure of InGaN/GaN, InGaN/InGaN, InGaN/AlGaN, or InGaN/InAlGaN or other like structure. The p-GaN layer 210 may be formed by doping a p-type dopant in a GaN layer after the GaN layer is formed, for example.

Figure 9D:
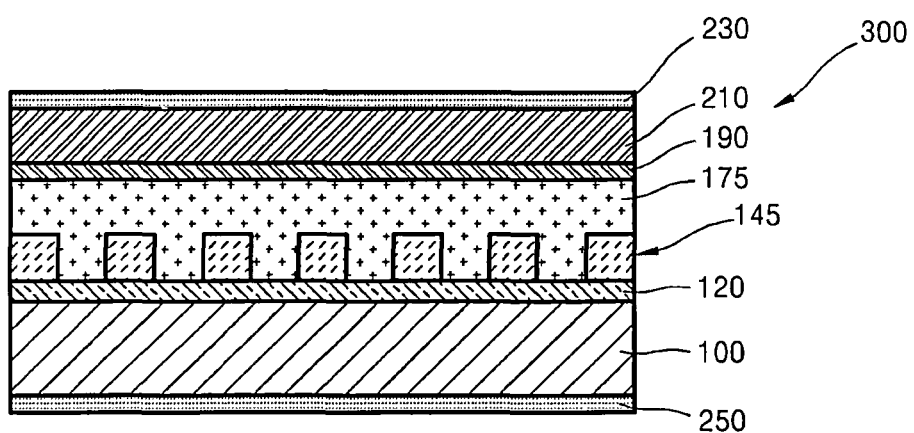

Referring to FIG. 9D, a p-electrode 230 and an n-electrode 250 may be formed in a vertical electrode structure, and for example, the p-electrode 230 may be formed on the p-GaN layer 210, and the n-electrode 250 may be formed on a lower surface of the silicon substrate 100, although numerous example embodiments may be formed. As other example embodiments provide, the n-electrode 250 may be formed on exposed portions of the n-GaN layer 175. The exposed portions of the n-GaN layer 175 may be formed by etching portions of the p-GaN layer 210 and the active layer 190 or other like process. Forming the p-electrode 230 and the n-electrode 250 in a vertical electrode structure may simplify manufacturing processes, and also may increase an effective area of the active layer 190 is increased. As example embodiments provide, increasing an effective area of the active layer 190 may increase light emission efficiency of the GaN-based light emitting device. TiN has a lower resistivity (approximately 15 μΩcm), and thus, the electrical conductivity of the silicon substrate 100 may be utilized. As example embodiments illustrate, the p-electrode 230 and the n-electrode 250 formed in a vertical electrode structure may be adopted in the GaN-based light emitting device.

A feature of a method of growing a GaN single crystal thin film according to example embodiments is using TiN which has a higher electrical and thermal conductivity. Thus, cracks generated during growing a GaN single crystal thin film can be reduced. Also, a higher quality GaN thin film having higher crystallinity may be grown by growing the GaN thin film on a silicon oxide film having a nano-pattern.

A GaN-based light emitting device including a silicon substrate according to example embodiments may have a lower manufacturing cost since the price of the silicon substrate may be less than the price of a sapphire substrate and the light emitting device may be formed using a larger diameter substrate. Using a larger diameter substrate in the light emitting device may increase productivity. Additionally, adopting a vertical electrode structure may reduce manufacturing processes and/or manufacturing costs.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of manufacturing a light emitting device, comprising:
    growing GaN single crystals by forming a buffer layer including a TiN group material contacting a silicon substrate, forming a nano-pattern including silicon oxide on the buffer layer, and growing the GaN single crystals on the buffer layer and the nano-pattern;
    forming an n-GaN layer on the buffer layer and the nano-pattern;
    forming an active layer on the n-GaN layer;
    forming a p-GaN layer on the active layer; and
    forming a p-electrode and an n-electrode, one of the p-electrode and the n-electrode being disposed on a surface of the silicon substrate,
    wherein forming the nano-pattern includes forming a silicon oxide layer by depositing $SiO_2$ on the buffer layer, forming a plurality of metal nano-dots on the silicon oxide layer, and dry etching the silicon oxide layer using the metal nano-dots as a mask.

2. The method of claim 1, wherein the metal nano-dots are formed by anodizing an aluminum thin film after depositing the aluminum thin film on the silicon oxide layer.

3. The method of claim 1, wherein the metal nano-dots are formed by annealing an Au thin film after depositing the Au thin film on the silicon oxide layer.

4. The method of claim 1, wherein the buffer layer is formed of $Al_xTi_{1-x}N$, where $0 \le x \le 0.5$, or $Cr_xTi_{1-x}N$, where $0 \le x \le 0.5$.

5. The method of claim 4, wherein the thickness of the buffer layer is in a range of 1 to 50 nm.

6. The method of claim 1, wherein the p-electrode is formed on the p-GaN layer, and the n-electrode is formed on a lower surface of the silicon substrate.

7. The method of claim 1, wherein the p-electrode is formed on the p-GaN layer, and the n-electrode is formed on exposed portions of the n-GaN layer formed by etching portions of the active layer and the p-GaN layer.

\* \* \* \* \*